(12) United States Patent
Na et al.

(10) Patent No.: US 8,319,241 B2
(45) Date of Patent: Nov. 27, 2012

(54) LIGHT EMITTING DEVICE, LIGHT EMITTING DEVICE PACKAGE, AND LIGHTING SYSTEM

(75) Inventors: Min Gyu Na, Seoul (KR); Myung Hoon Jung, Seoul (KR); Sung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 73 days.

(21) Appl. No.: 13/042,884

(22) Filed: Mar. 8, 2011

(65) Prior Publication Data

US 2011/0220946 A1 Sep. 15, 2011

(30) Foreign Application Priority Data

Mar. 9, 2010 (KR) .................. 10-2010-0020923

(51) Int. Cl.
*H01L 33/00* (2010.01)
(52) U.S. Cl. .................. 257/98; 257/E33.059
(58) Field of Classification Search .................. 257/17, 257/79, 80, 98, 99, E33.059
See application file for complete search history.

(56) References Cited

U.S. PATENT DOCUMENTS

| | | | | |
|---|---|---|---|---|
| 6,906,326 B2* | 6/2005 | Koch et al. | .................. | 250/338.4 |
| 7,105,425 B1* | 9/2006 | Krivokapic | .................. | 438/481 |
| 7,239,001 B2* | 7/2007 | Pautet et al. | .................. | 257/440 |
| RE40,163 E * | 3/2008 | Hori et al. | .................. | 257/79 |
| 8,168,993 B2* | 5/2012 | Jeong | .................. | 257/98 |
| 2006/0225644 A1 | 10/2006 | Lee et al. | | |
| 2007/0267640 A1 | 11/2007 | Lee et al. | | |
| 2009/0014713 A1 | 1/2009 | Kang et al. | | |
| 2009/0152578 A1 | 6/2009 | Lee | | |
| 2009/0272993 A1* | 11/2009 | Cheong | .................. | 257/94 |

FOREIGN PATENT DOCUMENTS

| | | |
|---|---|---|
| DE | 102 45 632 A1 | 4/2004 |
| JP | 2009-164648 A | 7/2009 |
| KR | 10-0771792 B1 | 10/2007 |
| KR | 10-2008-0070414 A | 7/2008 |
| KR | 10-2009-0021933 A | 3/2009 |

* cited by examiner

*Primary Examiner* — Nathan Ha
(74) *Attorney, Agent, or Firm* — Birch, Stewart, Kolasch & Birch, LLP (57) ABSTRACT

Provided is a light emitting device. The light emitting device includes a first conductive type semiconductor layer, an active layer on the first conductive type semiconductor layer, a second conductive type semiconductor layer on the active layer, an undoped semiconductor layer disposed on the second conductive type semiconductor layer and comprising a plurality of first holes, and a third conductive type semiconductor layer disposed on the undoped semiconductor layer and comprising a plurality of second holes.

20 Claims, 11 Drawing Sheets

LIGHT EMITTING DEVICE, LIGHT EMITTING DEVICE PACKAGE, AND LIGHTING SYSTEM

The present application claims priority under 35 U.S.C. 119 to Korean Patent Application No. 10-2010-0020923 filed Mar. 9, 2010, which is hereby incorporated by reference in its entirety.

BACKGROUND

The present disclosure relates to a light emitting device, a method of fabricating the light emitting device, a light emitting device package, and a lighting system.

Light emitting diodes (LED) are semiconductor devices that convert electric energy into light. LEDs are more advantageous in many respects such as low power consumption, a semi-permanent life cycle, a fast response time, safety, and eco-friendly characteristics than light sources of the related art such as a fluorescent lamp and an incandescent bulb. Many studies have been conducted to replace existing light sources with LEDs, and LEDs are being increasingly used as light sources of lighting devices such as indoor and outdoor lamps, liquid crystal displays, electronic boards, and streetlights.

SUMMARY

Embodiments provides a light emitting device having an improved structure, a method of fabricating the light emitting device, a light emitting device package, and a lighting system.

Embodiments also provide a light emitting device having improved light emitting efficiency and a method of fabricating the light emitting device.

In one embodiment, a light emitting device comprises: a first conductive type semiconductor layer; an active layer on the first conductive type semiconductor layer; a second conductive type semiconductor layer on the active layer; an undoped semiconductor layer disposed on the second conductive type semiconductor layer and comprising a plurality of first holes; and a third conductive type semiconductor layer disposed on the undoped semiconductor layer and comprising a plurality of second holes.

In another embodiment, a light emitting device packages comprises: a body; at least one lead electrode on the body; and a light emitting device electrically connected to the lead electrode, wherein the light emitting device comprises: a first conductive type semiconductor layer; an active layer on the first conductive type semiconductor layer; a second conductive type semiconductor layer on the active layer; an undoped semiconductor layer disposed on the second conductive type semiconductor layer and comprising a plurality of first holes; and a third conductive type semiconductor layer disposed on the undoped semiconductor layer and comprising a plurality of second holes.

In further another embodiment, a lighting system comprises: a board; and a light emitting module disposed on the board and comprising a light emitting device, wherein the light emitting device comprises: a first conductive type semiconductor layer; an active layer on the first conductive type semiconductor layer; a second conductive type semiconductor layer on the active layer; an undoped semiconductor layer disposed on the second conductive type semiconductor layer and comprising a plurality of first holes; and a third conductive type semiconductor layer disposed on the undoped semiconductor layer and comprising a plurality of second holes.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, with reference to the accompanying drawings, a light emitting device, a method of fabricating the light emitting device, a light emitting device package, and a lighting system will be described according to exemplary embodiments.

Figure 1:
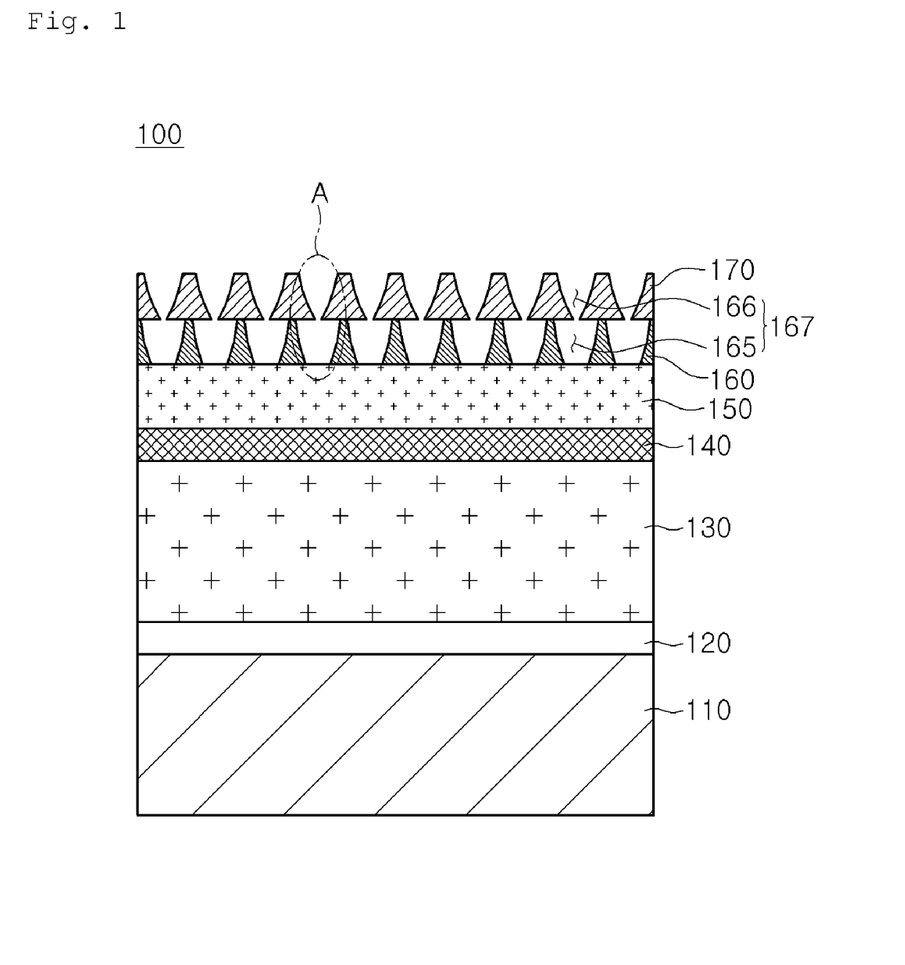
FIG. 1 is a sectional view of a light emitting device according to an embodiment.
Figure 2:
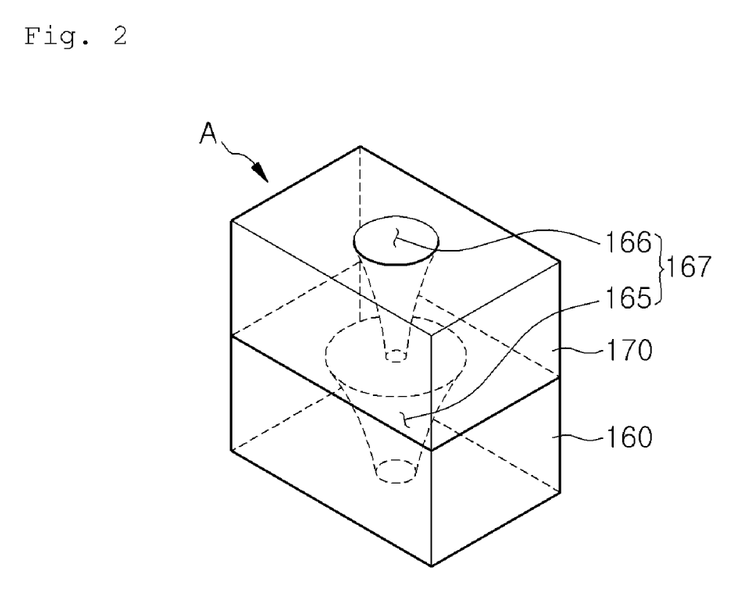
FIG. 2 is an enlarged perspective view illustrating portion A of FIG. 1.

FIG. 1 is a sectional view illustrating a light emitting device 100 according to an embodiment, and FIG. 2 is an enlarged perspective view illustrating portion A of FIG. 1.

Referring to FIGS. 1 and 2, the light emitting device 100 of the current embodiment may comprise: a substrate 110; a buffer layer 120 on the substrate 110; a first conductive type semiconductor layer 130 on the buffer layer 120; an active layer 140 on the first conductive type semiconductor layer 130; a second conductive type semiconductor layer 150 on the active layer 140; an undoped semiconductor layer 160 disposed on the second conductive type semiconductor layer 150 and comprising a plurality of first holes 165; and a third conductive type semiconductor layer 170 disposed on the undoped semiconductor layer 160 and comprising a plurality of second holes 166.

The first holes 165 of the undoped semiconductor layer 160 and the second holes 166 of the third conductive type semiconductor layer 170 may have a horn shape or a truncated horn shape. The first holes 165 and/or the second holes 166 may have relatively narrow lower parts and relatively wide upper parts, or the first holes 165 and/or the second holes 166 may be incrementally widened from lower side to upper side. The outside of the horn or truncated horn shape may have a curved surface or a polygonal surface.

The holes 165 and 166, that is the holes 167, may be overlapped with each other in a vertical direction. The first holes 165 and the second holes 166 may be connected to each other in the vertical direction. The first holes 165 and the second holes 166 may be filled with air or a transparent material having a band gap smaller than that of a semiconductor material of the semiconductor layers.

Light generated in the active layer 140 may be extracted at the topside of the light emitting device 100 through the undoped semiconductor layer 160 and the third conductive type semiconductor layer 170. The undoped semiconductor layer 160 may be a porous semiconductor layer, and the third conductive type semiconductor layer 170 may be a porous semiconductor layer.

Generally, light can be efficiently extracted at the topside of a light emitting device, for example, by scattering, diffraction, and refraction of the light at holes formed in the topside of the light emitting device.

Hereinafter, elements of the light emitting device 100 will be described in detail according to the embodiment.

The substrate 110 may be formed of at least one of $Al_2O_3$ (sapphire), SiC, GaAs, GaN, ZnO, Si, GaP, InP, and Ge, but not limited thereto. The topside of the substrate 110 may have a concave-convex structure in which concave and convex parts are alternately arranged. However, the substrate 110 is not limited thereto.

The buffer layer 120 may be disposed on the substrate 110. The buffer layer 120 may be provided to reduce a lattice constant difference between the substrate 110 and the first conductive type semiconductor layer 130. The buffer layer 120 may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the buffer layer 120 may be formed of one of GaN, AlN, AlGaN, InGaN, InN, InAlGaN, and AlInN.

The first conductive type semiconductor layer 130 may be formed on the buffer layer 120. An undoped semiconductor layer may be further formed under the first conductive type semiconductor layer 130. However, the current embodiment is not limited thereto.

For example, the first conductive type semiconductor layer 130 may comprise an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlInN, AlN, and InN. The n-type semiconductor layer may be doped with an n-type dopant such as Si, Ge, and Sn.

The undoped semiconductor layer is an undoped GaN-based semiconductor layer, which is not doped with a conductive dopant and thus has an electric conductivity much lower than that of the first conductive type semiconductor layer 130 or the second conductive type semiconductor layer 150. The undoped semiconductor layer may be grown to improve crystallization of the first conductive type semiconductor layer 130.

The active layer 140 may be disposed on the first conductive type semiconductor layer 130. Electrons (or holes) injected through the first conductive type semiconductor layer 130, and holes (or electrons) injected through the second conductive type semiconductor layer 150 may meet at the active layer 140, and as a result, light may be emitted from the active layer 140 according to energy band gap differences of materials forming the active layer 140.

The active layer 140 may have one of a single quantum well structure, a multi quantum well structure, a quantum wire structure, and a quantum dot structure. The active layer 140 may be formed at a cycle of a well layer/barrier layer using a group III-V compound semiconductor material. For example, the active layer 140 may have at least one of an InGaN/GaN structure, an InGaN/AlGaN structure, and an InGaN/InGaN structure. The barrier layer may be formed of a material having a band gap greater than that of the well layer, but is not limited thereto. The active layer 140 may comprise a semiconductor material having a compositional formula of $In_xAl_yGa_{1-x-y}N$ ($0 \leq x \leq 1$, $0 \leq y \leq 1$, $0 \leq x+y \leq 1$).

A clad layer in which an n-type or p-type dopant is doped may be disposed above/under the active layer 140. The clad layer may be an AlGaN layer or an InAlGaN layer.

The second conductive type semiconductor layer 150 may be disposed on the active layer 140. For example, the second conductive type semiconductor layer 150 may be a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlInN, AlN, and InN. The second conductive type semiconductor layer 150 may be doped with a p-type dopant such as Mg and Zn.

The undoped semiconductor layer 160 may be disposed on the second conductive type semiconductor layer 150. The undoped semiconductor layer 160 may be formed of a semiconductor material having a compositional formula of $In_xAl_yGa_{1-x-y}N$ ($0 \leq x \leq 1$, $0 \leq y \leq 1$, $0 \leq x+y \leq 1$). The undoped semiconductor layer 160 is a semiconductor layer which is not doped with a conductive dopant or is very lightly doped with a conductive dopant as compared with the second conductive type semiconductor layer 150.

The undoped semiconductor layer 160 may comprise the first holes 165. The first holes 165 may be formed by selectively removing the undoped semiconductor layer 160 through a wet etching process using, for example, potassium hydroxide (KOH).

In the case where the first holes 165 are formed through a wet etching process, since wet etching may be an isotropic etching process, the first holes 165 may have curved lateral surfaces, and the upper sides of the first holes 165 may be greater than the lower sides of the first holes 165. However, the current embodiment is not limited thereto.

The third conductive type semiconductor layer 170 may be disposed on the undoped semiconductor layer 160.

The third conductive type semiconductor layer 170 may be formed of the same material that used to form the second conductive type semiconductor layer 150. For example, the third conductive type semiconductor layer 170 may be formed as a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlInN, AlN, and InN. Also, the p-type semiconductor layer may be doped with a p-type dopant such as Mg and Zn.

The third conductive type semiconductor layer 170 may comprise the second holes 166. In detail, the second conductive type semiconductor layer 150 may be grown in a high temperature range from about 1000° C. to about 1200° C., and the third conductive type semiconductor layer 170 may be grown in a relatively low temperature range from about 800° C. to about 900° C. Thus, in the third conductive type semiconductor layer 170, dislocations may develop as the second holes 166.

The second holes 166 may have a horn or truncated horn shape such as cone, polygonal pyramid, truncated cone, and truncated polygonal pyramid shapes.

The second holes 166 may be formed by etching. However, the current embodiment is not limited thereto.

In the current embodiment, the first holes 165 and the second holes 166 may form multiple holes 167 penetrating the undoped semiconductor layer 160 and the third conductive type semiconductor layer 170.

That is, the bottom sides of the second holes 166 may be greater than the topsides of the first holes 165, and thus boundary regions between the first holes 165 and the second holes 166 may have a stepped shape. In addition, the areas of the bottom sides of the second holes 166 of the third conductive type semiconductor layer 170 may be different from the areas of the bottom sides of the first holes 165 of the undoped semiconductor layer 160.

The topside of the undoped semiconductor layer 160 may have an area smaller than the area of the bottom side of the third conductive type semiconductor layer 170. However, the current embodiment is not limited thereto.

Light generated in the active layer 140 may be efficiently extracted through the topside of the light emitting device 100 according to the geometry of the holes 167.

For example, the holes 167 may be arranged at intervals of about 50 nm to about 3000 nm so that light having a particular wavelength can be efficiently extracted. However, the current embodiment is not limited thereto.

Hereinafter, a method of fabricating the light emitting device 100 will be described in detail according to the embodiment. In the following description, the same description as above will be omitted or briefly given.

Figure 3:
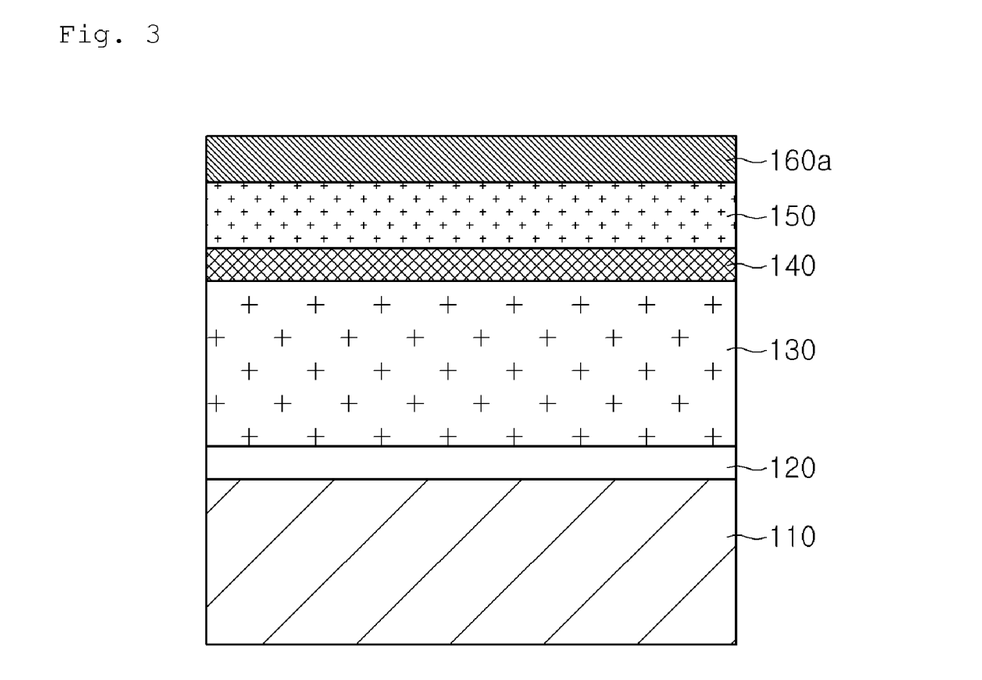
FIGS. 3 to 5 are views for explaining a method of fabricating a light emitting device according to an embodiment.
Figure 4:
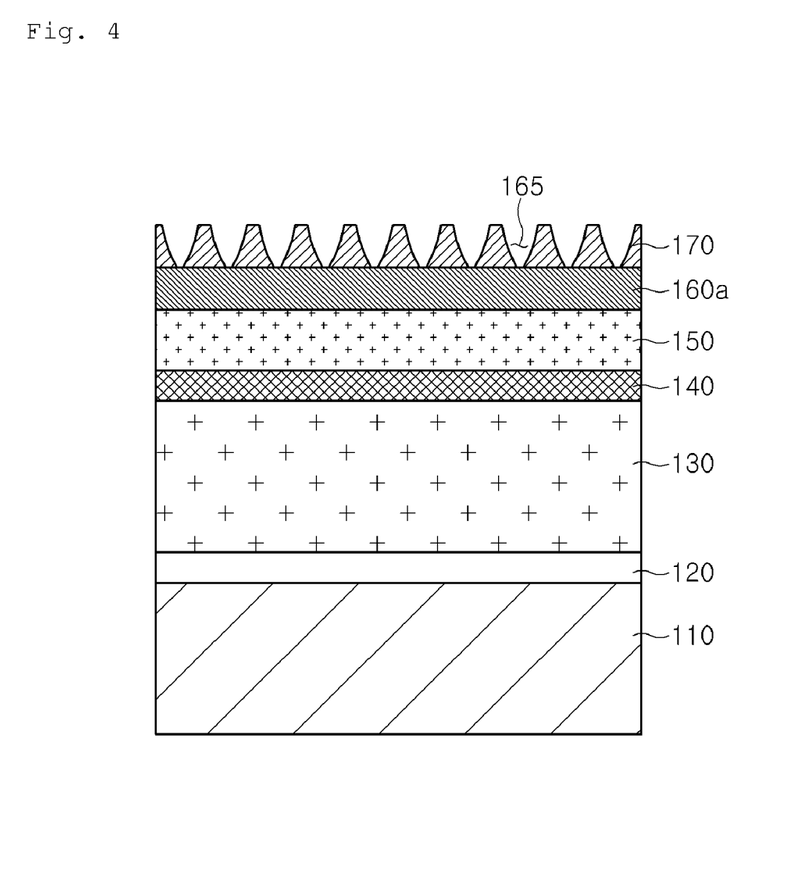
Figure 5:
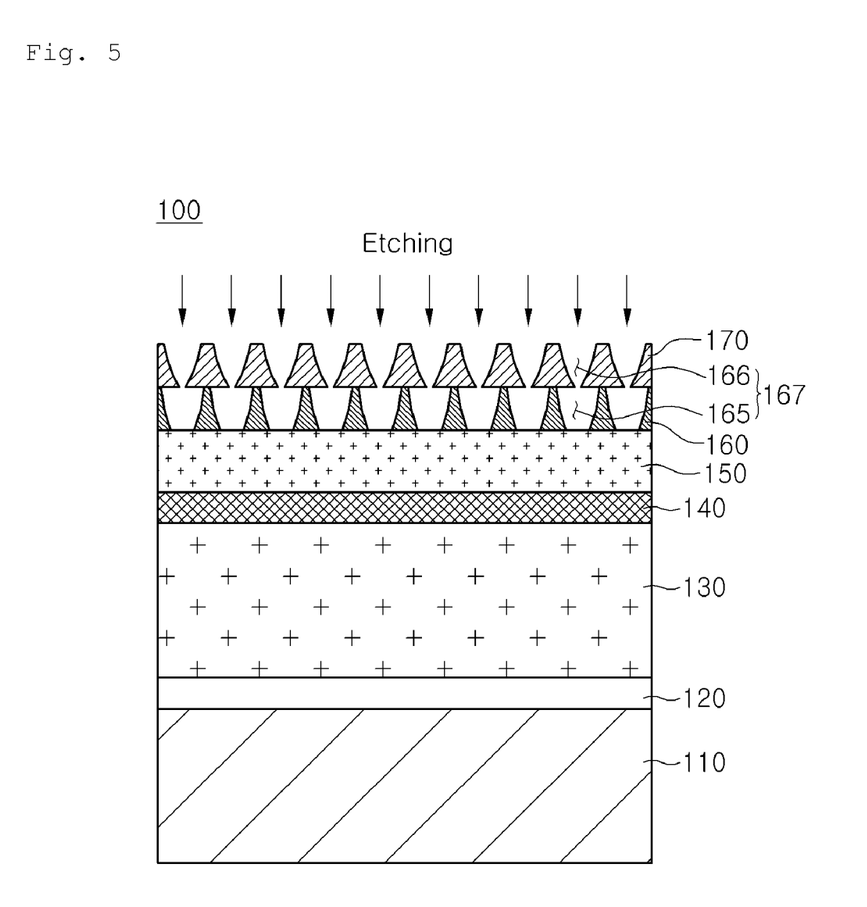

FIGS. 3 to 5 are views for explaining a method of fabricating a light emitting device 100 according to an embodiment.

Referring to FIG. 3, a first conductive type semiconductor layer 130, an active layer 140, a second conductive type semiconductor layer 150, and an undoped semiconductor layer 160a may be sequentially disposed on a substrate 110.

The first conductive type semiconductor layer 130, the active layer 140, the second conductive type semiconductor layer 150, and the undoped semiconductor layer 160a may be disposed on the substrate 110 by a method such as a metal organic chemical vapor deposition (MOCVD) method, a chemical vapor deposition (CVD) method, a plasma-enhanced chemical vapor deposition (PECVD), a molecular beam epitaxy (MBE) method, or a hydride vapor phase epitaxy (HVPE) method. However, the current embodiment is not limited thereto.

The undoped semiconductor layer 160a may be formed of a group III-V compound semiconductor not doped with an n-type or p-type dopant. Alternatively, the undoped semiconductor layer 160a may be relatively lightly doped with a dopant as compared with the second conductive type semiconductor layer 150 and the third conductive type semiconductor layer 170. The undoped semiconductor layer 160a may be non-conductive. The topside of the undoped semiconductor layer 160a may be planar.

Referring to FIG. 4, a third conductive type semiconductor layer 170 comprising a plurality of second holes 166 may be disposed on the undoped semiconductor layer 160a.

The third conductive type semiconductor layer 170 may be formed of a semiconductor material having a compositional formula of $In_xAl_yGa_{1-x-y}N$ ($0 \leq x \leq 1$, $0 \leq y \leq 1$, $0 \leq x+y \leq 1$).

The third conductive type semiconductor layer 170 may be grown in a relatively low temperature range from about 800° C. to about 900° C. in a manner such that the second holes 166 are formed in the third conductive type semiconductor layer 170.

In detail, the second conductive type semiconductor layer 150 and the third conductive type semiconductor layer 170 may be formed of the same material. However, the second conductive type semiconductor layer 150 may be formed in a relatively high temperature range from about 1000° C. to about 1200° C., and the third conductive type semiconductor layer 170 may be grown in a relatively low temperature range from about 800° C. to about 900° C.

Therefore, the top surface of the second conductive type semiconductor layer 150 may be relatively flat, and dislocations may develop into the second holes 166 in the third conductive type semiconductor layer 170. At this time, the second holes 166 may be formed through the third conductive type semiconductor layer 170, and thus the top surface of the undoped semiconductor layer 160 may be partially exposed.

Alternatively, the second holes 166 may be formed by providing a mask on the third conductive type semiconductor layer 170 and etching the third conductive type semiconductor layer 170 by using the mask. However, the current embodiment is not limited thereto.

Referring to FIG. 5, an etch mask may be provided on the third conductive type semiconductor layer 170, and the undoped semiconductor layer 160 may be etched using the etch mask to form a plurality of first holes 165 in the undoped semiconductor layer 160. In this way, a light emitting device 100 may be fabricated.

The etching process may be a wet etching process using a KOH solution as an etchant. However, the current embodiment is not limited thereto. A semiconductor layer doped with a conductive dopant to a predetermined concentration or higher is not etched with the KOH solution, but a semiconductor layer doped with a conductive dopant to a predetermined concentration or lower is etched with the KOH solution.

Therefore, the undoped semiconductor layer 160 can be selectively etched by using the KOH solution because the doping concentration of the undoped semiconductor layer 160 is much lower than the doping concentrations of the second conductive type semiconductor layer 150 and the third conductive type semiconductor layer 170. However, the second and third conductive type semiconductor layers 150 and 170 are not removed but function as an etch stop layer and an etch mask in the etching process. In this way, the first and second holes 165 and 166 may be formed.

In the current embodiment, it is unnecessary to form an additional mask and an etch stop layer owing to the second and third conductive type semiconductor layers 150 and 170. Therefore, the fabricating process can be efficiently performed.

In the current embodiment, owing to horn or truncated horn shaped holes 167 formed by the first holes 165 penetrating the undoped semiconductor layer 160 and the second holes 166 penetrating the third conductive type semiconductor layer 170, the light extraction efficiency of the light emitting device 100 can be maximized.

The holes 165 and 166 may be overlapped with each other in a vertical direction. The first holes 165 and the second holes 166 may be connected to each other in the vertical direction. The first holes 165 and the second holes 166 may be filled with air or a transparent material having a band gap smaller than that of a semiconductor material of the semiconductor layers.

Hereinafter, an explanation will be given on a light emitting device 100A having a horizontal electrode structure formed on the light emitting device 100 of the above-described embodiment.

Figure 6:
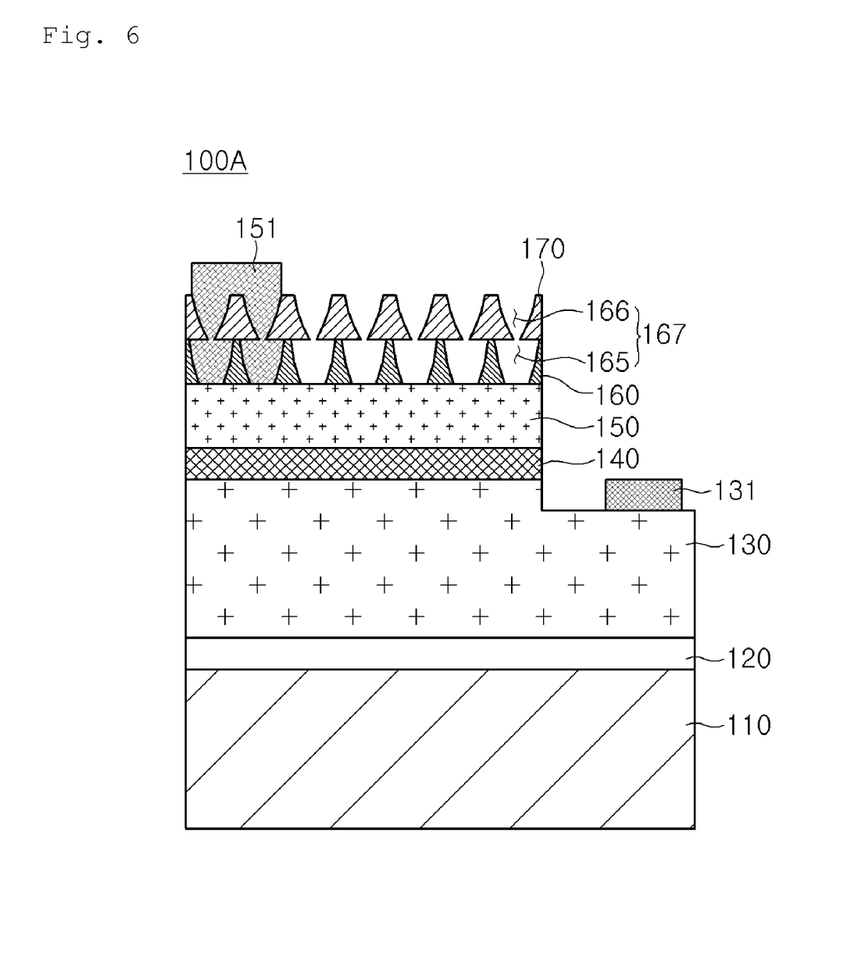
FIG. 6 is a sectional view illustrating a light emitting device having a horizontal electrode structure according to an embodiment.

FIG. 6 is a sectional view illustrating a light emitting device 100A having a horizontal electrode structure formed on the light emitting device 100 of the above-described embodiment.

Referring to FIG. 6, the light emitting device 100A may comprise: a substrate 110; a buffer layer 120 on the substrate 110; a first conductive type semiconductor layer 130 on the buffer layer 120; an active layer 140 on the first conductive type semiconductor layer 130; a second conductive type semiconductor layer 150 on the active layer 140; an undoped semiconductor layer 160 disposed on the second conductive type semiconductor layer 150 and comprising a plurality of first holes 165; a third conductive type semiconductor layer 170 disposed on the undoped semiconductor layer 160 and comprising a plurality of second holes 166; a first electrode 131 on the first conductive type semiconductor layer 130, and a second electrode 151 on the second conductive type semiconductor layer 150.

The second electrode 151 may comprise a transparent electrode layer or a reflective electrode layer. The transparent electrode layer or the reflective electrode layer may be in contact with at least one of the third conductive type semiconductor layer 170, the undoped semiconductor layer 160, and the second conductive type semiconductor layer 150. However, the current embodiment is not limited thereto. The transparent electrode layer may comprise at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO. However, the current embodiment is not limited thereto. The reflective electrode layer may comprise a highly reflective material. For example, the reflective electrode layer may comprise at least one of Ag, Rh, Ni, Au, Pd, Ir, Ti, Pt, W, and Al.

Since the first electrode 131 and the second electrode 151 are horizontally arranged, the light emitting device 100A shown in FIG. 6 may be defined as a light emitting device having a horizontal electrode structure. After etching the light emitting device 100 shown in FIG. 1 by a mesa etching method to expose the first conductive type semiconductor layer 130, the first electrode 131 may be formed on the first conductive type semiconductor layer 130.

The first and second electrodes 131 and 151 may be formed by a method such as deposition and plating. However, the current embodiment is not limited thereto.

Hereinafter, an explanation will be given on a light emitting device 100B having a vertical electrode structure formed on the light emitting device 100 of the above-described embodiment.

Figure 7:
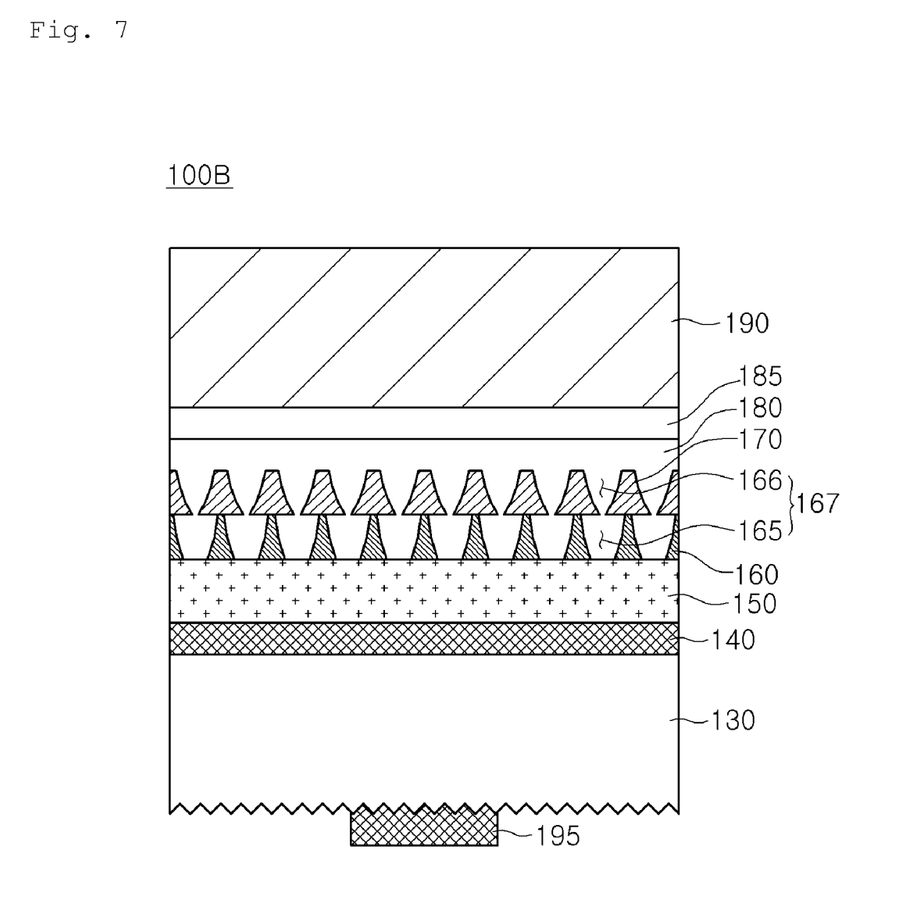
FIG. 7 is a sectional view illustrating a light emitting device having a vertical electrode structure according to an embodiment.

FIG. 7 is a sectional view illustrating a light emitting device 100B having a vertical electrode structure formed on the light emitting device 100 of the above-described embodiment.

Referring to FIG. 7, the light emitting device 100B may comprise: a first conductive type semiconductor layer 130; an active layer 140 on the first conductive type semiconductor layer 130; a second conductive type semiconductor layer 150 on the active layer 140; an undoped semiconductor layer 160 disposed on the second conductive type semiconductor layer 150 and comprising a plurality of first holes 165; a third conductive type semiconductor layer 170 disposed on the undoped semiconductor layer 160 and comprising a plurality of second holes 166; an ohmic layer 180 disposed on the third conductive type semiconductor layer 170 and in the first and second holes 165 and 166; a reflective layer 185 on the ohmic layer 180; a conductive support member 190 on the reflective layer 185; and an electrode 195 under the first conductive type semiconductor layer 130.

The light emitting device 100B is operated by power received through the electrode 195 and the conductive support member 190 which are vertically arranged. Thus, the light emitting device 100B may be defined as a light emitting device having a vertical electrode structure.

The light emitting device 100B may be formed by: sequentially forming the ohmic layer 180, the reflective layer 185, and the conductive support member 190 on the light emitting device 100 of FIG. 1; removing the substrate 110; and forming the electrode 195.

The ohmic layer 180 may be disposed on the top surface of the third conductive type semiconductor layer 170 and in the first and second holes 165 and 166. The ohmic layer 180 may make ohmic contact with the third conductive type semiconductor layer 170 and the second conductive type semiconductor layer 150 to transmit power from the conductive support member 190 to the third conductive type semiconductor layer 170 and the second conductive type semiconductor layer 150.

The ohmic layer 180 may be formed of at least one of a conductive metal oxide, a conductive metal nitride, and a metal. For example, the ohmic layer 180 may comprise at least one of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO. Alternatively, the ohmic layer 180 may comprise one of Ag, Ni, Al, Rh, Pd, Ir, Ru, Mg, Zn, Pt, Au, Hf, and combinations thereof.

The reflective layer 185 may be disposed on the ohmic layer 180. The reflective layer 185 may reflect light incident from the active layer 140 to improve light extraction efficiency.

The reflective layer 185 may comprise a highly reflective material. For example, the reflective layer 185 may comprise at least one of Ag, Rh, Ni, Au, Pd, Ir, Ti, Pt, W, and Al.

According to the design of the Light emitting device 100B, both the ohmic layer 180 and the reflective layer 185 may not be formed, or only one of the ohmic layer 180 and the reflective layer 185 may be formed. However, the current embodiment is not limited thereto.

The conductive support member 190 supports the light emitting device 100B, and power is supplied to the light emitting device 100B through the conductive support member 190 and the electrode 195. For example, the conductive support member 190 may comprise at least one of titanium (Ti), chromium (Cr), nickel (Ni), aluminum (Al), platinum (Pt), gold (Au), tungsten (W), copper (Cu), molybdenum (Mo), copper-tungsten (Cu—W), and a carrier wafer (which is a doped semiconductor substrate formed of a material such as Si, Ge, GaN, GaAs, ZnO, SiC, and SiGe).

The substrate 110 may be removed after the conductive support member 190 is disposed. For example, the substrate 110 may be removed by at least one of a laser lift off (LLO) process and an etching process. However, the current embodiment is not limited thereto.

After removing the substrate 110, an etching process may be performed on the exposed first conductive type semiconductor layer 130 to remove unnecessary layers such as the buffer layer 120 and make the surface of the first conductive type semiconductor layer 130 rough. By making the surface of the first conductive type semiconductor layer 130 rough, light may be extracted from the light emitting device 100B more efficiently.

The electrode 195 may be disposed on the bottom surface of the first conductive type semiconductor layer 130. The electrode 195 may be formed by a method such as deposition and plating. The electrode 195 may be connected to the first conductive type semiconductor layer 130 directly or indirectly.

Figure 8:
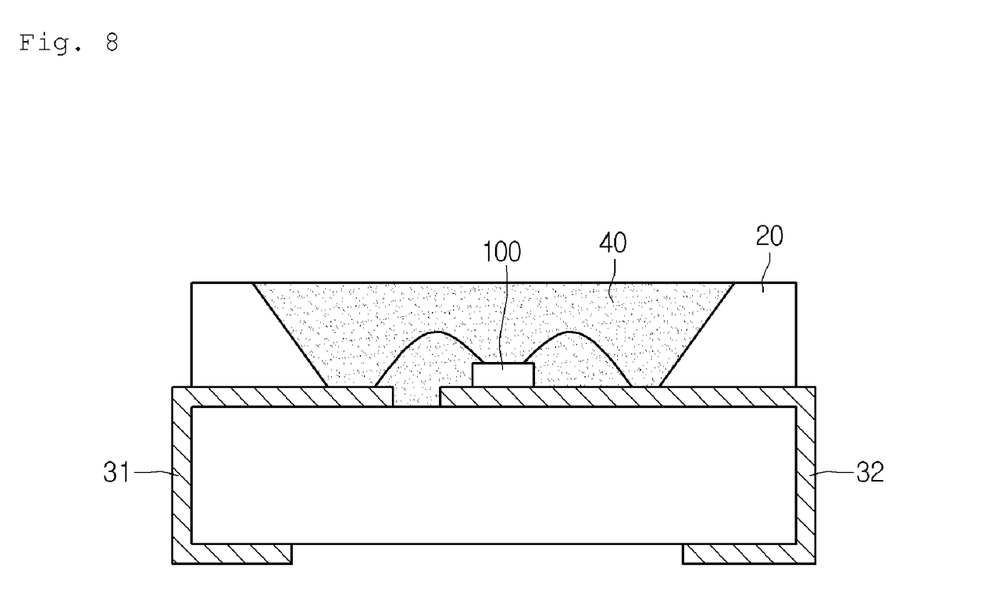
FIG. 8 is a sectional view illustrating a light emitting device package comprising a light emitting device according to an embodiment.

FIG. 8 is a sectional view illustrating a light emitting device package comprising a light emitting device according to an embodiment.

Referring to FIG. 8, the light emitting device package comprises: a body 20; first and second lead electrodes 31 and 32 on the body 20; the light emitting device 100 of the previous embodiment disposed on the body 20 and electrically connected to the first and second lead electrodes 31 and 32; and a molding member 40 surrounding the light emitting device 100.

The body 20 may be formed of a silicon material, a synthetic resin material, or a metal material. Also, an inclined surface may be disposed around the light emitting device 100.

The first and second lead electrodes 31 and 32 are electrically separated from each other and are configured to supply power to the light emitting device 100. In addition, the first and second lead electrodes 31 and 32 may reflect light generated in the light emitting device 100 to increase light efficiency and may dissipate heat generated in the light emitting device 100 to the outside.

The light emitting device 100 may be disposed on the body 20 or on the first or second lead electrodes 31 or 32.

The light emitting device 100 may be connected to the first and second lead electrodes 31 and 32 by one of a wire bonding method, a flip chip bonding method, and a die bonding method.

The molding member 40 may surround the light emitting device 100 to protect the light emitting device 100. In addition, a phosphor may be contained in the molding member 40 to change the wavelength of light emitted from the light emitting device 100.

Unlike the above description, the first conductive type semiconductor layer 130 may comprise a p-type semiconductor layer, and the second and third conductive type semiconductor layers 150 and 170 may comprise n-type semiconductor layers. In addition, the first, second, and third conductive type semiconductor layers 130, 150, and 170 may be doped with conductive type dopants uniformly or non-uniformly That is, the first, second, and third conductive type semiconductor layers 130, 150, and 170 may be formed into various structures. However, the scope of the present disclosure is not limited thereto.

The light emitting devices of the embodiments may be packaged on a board such as a semiconductor board, an insulation board, and a ceramic board, so as to be used as light sources of indicators, lighting devices, display devices, etc. Any one of the above-described embodiments is not limited to the above description. For example, one embodiment may be applied to another embodiment.

The light emitting device package of the embodiment may be used for a light unit. The light unit may comprise an array of a plurality of light emitting device packages.

Figure 9:
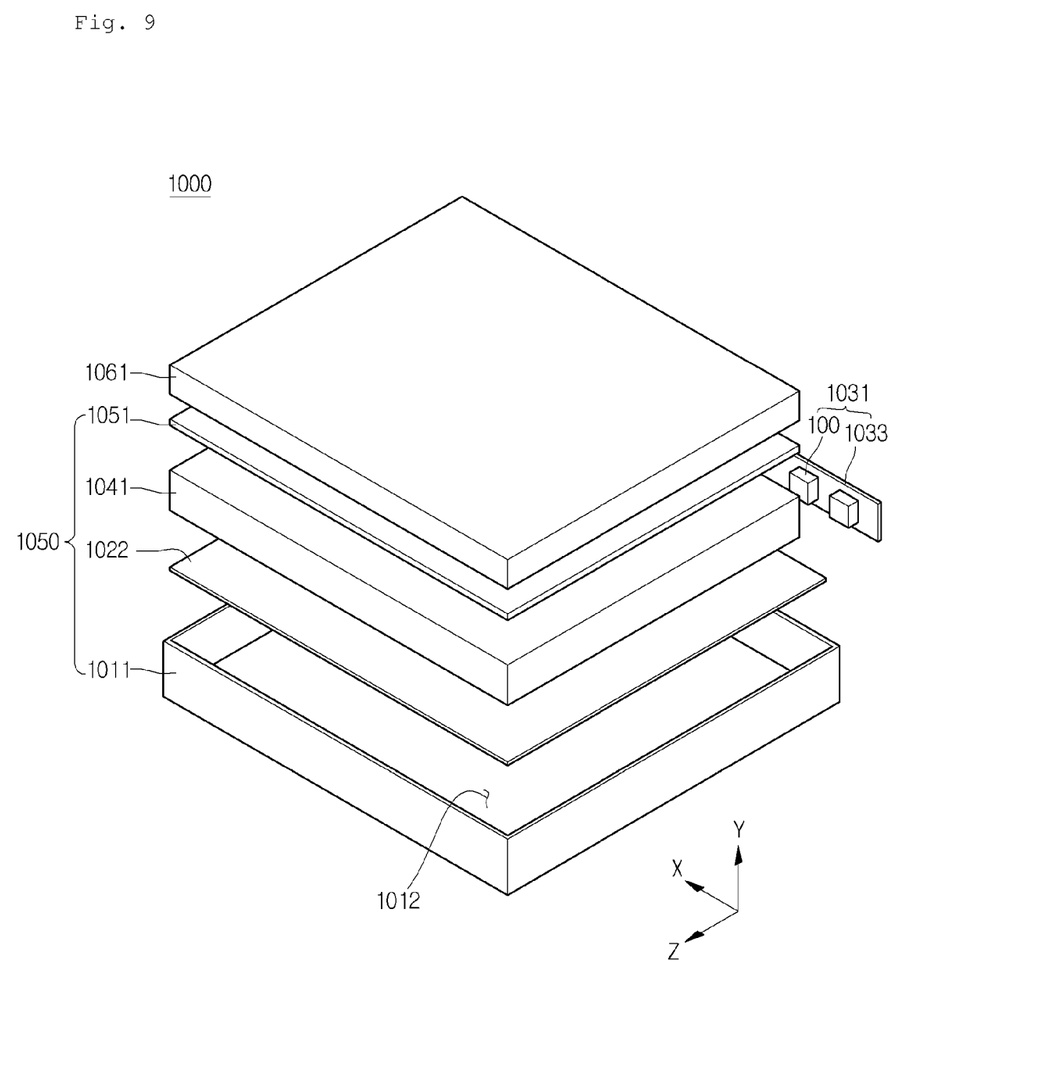
FIG. 9 is a view illustrating a display device according to an embodiment.

FIG. 9 is an exploded perspective view illustrating a display device 1000 according to an embodiment.

The display device 1000 of the current embodiment may comprise: a light guide plate 1041; a light emitting module 1031 configured to emit light toward the light guide plate 1041; a reflective member 1022 under the light guide plate 1041; an optical sheet 1051 on the light guide plate 1041; a display panel 1061 on the optical sheet 1051; and a bottom cover 1011 receiving the light guide plate 1041, the light emitting module 1031, and the reflective member 1022. However, the current embodiment is not limited thereto.

The bottom cover 1011, the reflective member 1022, the light emitting module 1031, the light guide plate 1041, and the optical sheet 1051 may be defined as a light unit 1050.

The light guide plate 1041 diffuses light to produce planar light like a surface light source. The light guide plate 1041 may be formed of a transparent material. For example, the light guide plate 1041 may comprise one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 provides light to at least one side surface of the light guide plate 1041. That is, the light emitting module 1031 is a light source of the display device 1000.

The display device 1000 may comprise at least one light emitting module 1031 that provides light to a lateral surface of the light guide plate 1041 directly or indirectly. The light emitting module 1031 comprises a board 1033, and light emitting devices 100 or light emitting device packages 100 such as described in the previous embodiments. The light emitting devices or the light emitting device packages 100 may be arranged on the board 1033 at predetermined intervals. That is, light emitting devices 100 may be arranged on the board 1033 in the form of chips or packages.

The board 1033 may be a printed circuit board (PCB) comprising a circuit pattern. Examples of the board 1033 may comprise a metal core PCB (MCPCB) and a flexible PCB (FPCB) as well as a general PCB. However, the current embodiment is not limited thereto. The light emitting device packages 100 may be disposed on a lateral side of the bottom cover 1011 or on a heat dissipation plate. In this case, the board 1033 may be not used. A part of the heat dissipation plate may be in contact with a top surface of the bottom cover 1011.

The light emitting device packages 100 may be disposed on the board 1033 in a manner such that light-exit surfaces of the light emitting device packages 100 are spaced a predetermined distance from the light guide plate 1041. However, the current embodiment is not limited thereto. Light may be provided from the light emitting device packages 100 to a later side (light entrance side) of the light guide plate 1041 directly or indirectly. However, the current embodiment is not limited thereto.

The reflective member 1022 may be disposed under the light guide plate 1041. The reflective member 1022 reflects light incident from a bottom surface of the light guide plate 1041 to an upper side so that the brightness of the light unit 1050 can be improved. The reflective member 1022 may be formed of a material such as PET, PC, and PVC resins. However, the current embodiment is not limited thereto. The reflective member 1022 may be disposed on a top surface of the bottom cover 1011. However, the current embodiment is not limited thereto.

The bottom cover 1011 may accommodate the light guide plate 1041, the light emitting module 1031, and the reflective member 1022. For this purpose, the bottom cover 1011 may comprise an accommodation part 1012 having a box shape with openings. However, the current embodiment is not limited thereto. The bottom cover 1011 may be coupled to a top cover. However, the current embodiment is not limited thereto.

The bottom cover 1011 may be formed of a metal material or a resin material. In addition, the bottom cover 1011 may be fabricated through a process such as a pressing process or an extrusion process. The bottom cover 1011 may comprise a metal or non-metal material having a higher thermal conductivity. However, the current embodiment is not limited thereto.

For example, the display panel 1061 may be a liquid crystal display (LCD) panel comprising: transparent first and second substrates facing each other; and a liquid crystal layer disposed between the first and second substrates. A polarizer may be attached to at least one surface of the display panel 1061. However, the current embodiment is not limited to the attachment structure of the polarizer. The display panel 1061 displays information by using light transmitted through the optical sheet 1051. For example, the display device 1000 may be used for monitors of various portable terminals, laptop or notebook computers, and televisions.

The optical sheet 1051 may be disposed between the display panel 1061 and the light guide plate 1041. The optical sheet 1051 may comprise at least one transparent sheet. For example, the optical sheet 1051 may comprise at least one of a diffusion sheet, horizontal and vertical prism sheets, and a brightness enhancement sheet. The diffusion sheet diffuses incident light. The horizontal and/or vertical prism sheets concentrate light on a display region. The brightness enhancement sheet increases brightness by reuse of losing light. In addition, a protective sheet may be disposed on the display panel 1061. However, the current embodiment is not limited thereto.

The light guide plate 1041 and the optical sheet 1051 may be optical members disposed along an optical path of the light emitting module 1031. However, the current embodiment is not limited thereto.

Figure 10:
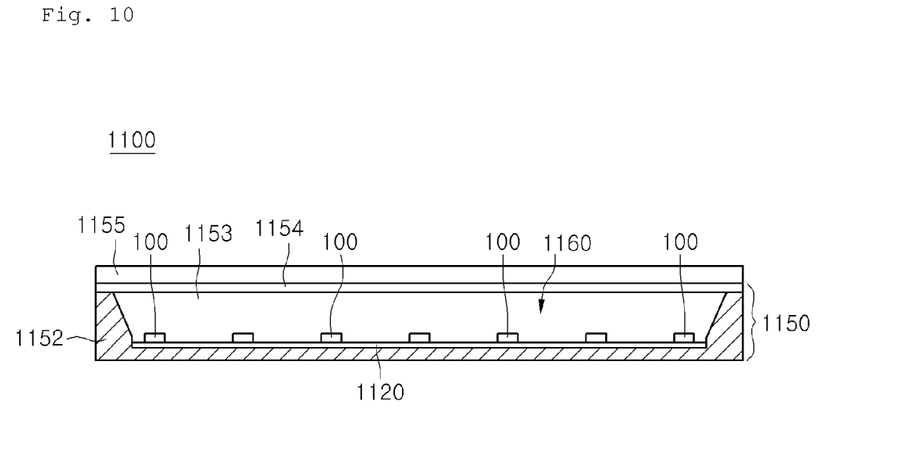
FIG. 10 is a view illustrating a display device according to another embodiment.

FIG. 10 is a view illustrating a display device 1100 according to another embodiment. In the embodiment shown in FIG. 10, light emitting devices are arranged in the form of chips or packages.

Referring to FIG. 10, the display device 1100 comprises a bottom cover 1152, a board 1120 on which light emitting device packages 100 are arranged, an optical member 1154, and a display panel 1155.

The board 1120 and the light emitting device packages 100 may be defined as a light emitting module 1060. The bottom cover 1152, at least one light emitting module 1060, and the optical member 1154 may be defined as a light unit. Light emitting devices may be arranged on the board 1120 in the form of chips or packages.

The bottom cover 1152 may comprise an accommodation part 1153. However, the current embodiment is not limited thereto.

For example, the optical member 1154 may comprise at least one of a lens, a light guide plate, a diffusion sheet, horizontal and vertical prism sheets, and a brightness enhancement sheet. The light guide plate may be formed of PC or PMMA. The light guide plate may not be used. The diffusion sheet diffuses incident light. The horizontal and vertical prism sheets concentrate light on a display region. The brightness enhancement sheet increases brightness by reuse of losing light.

Figure 11:
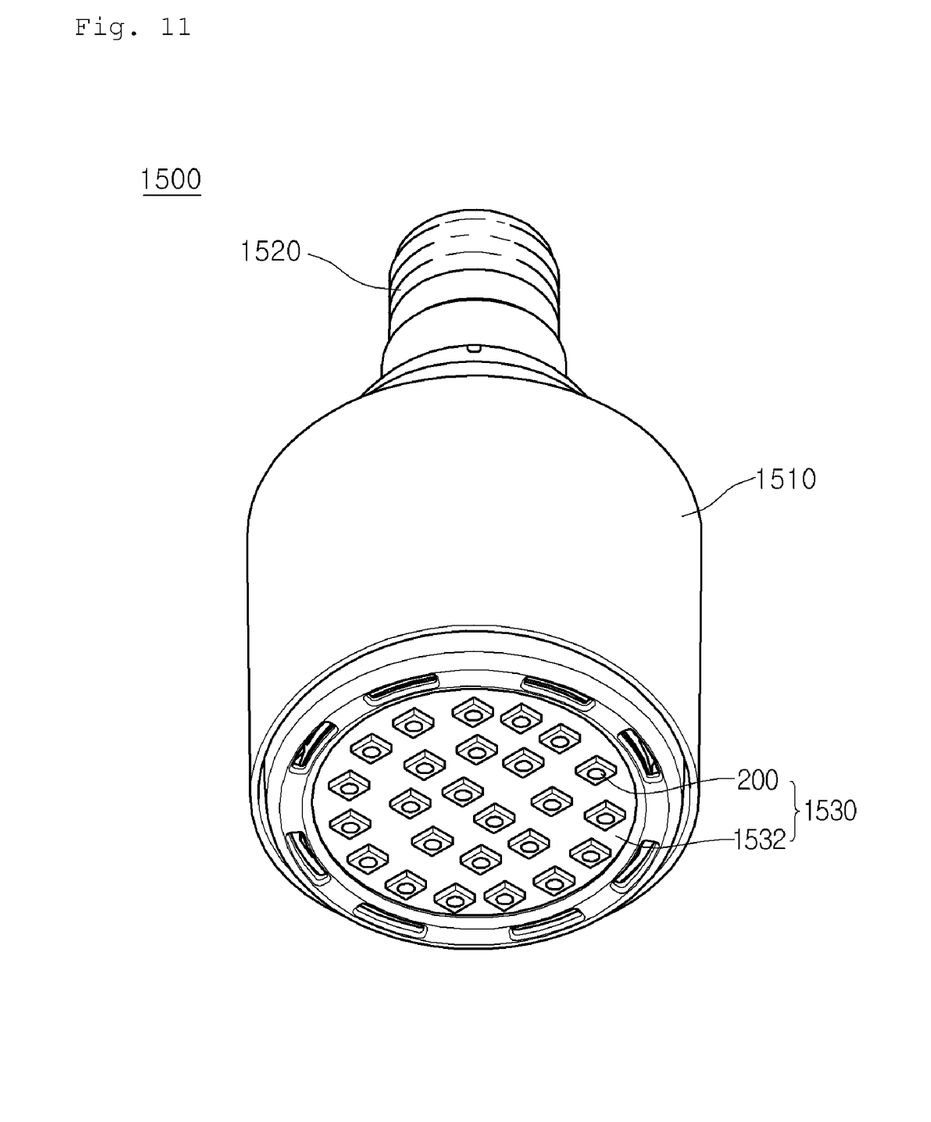
FIG. 11 is a view illustrating a lighting system according to an embodiment.

FIG. 11 is a perspective view of a lighting system 1500 according to an embodiment.

Referring to FIG. 11, the lighting system 1500 may concentrate a case 1510, a light emitting module 1530 disposed in the case 1510, a connection terminal 1520 disposed on the case 1510 to receive power from an external power source.

The case 1510 may be formed of a material having good heat dissipation characteristics, such as a metal material or a resin material.

The light emitting module 1530 may comprise a board 1532, and light emitting devices 200 or light emitting device packages 200 disposed on the board 1532. The light emitting device packages 200 may be arranged in a matrix format or at predetermined intervals. Light emitting devices may be arranged on the board 1532 in the form of chips or packages.

The board 1532 may be an insulator on which a circuit pattern is printed. Examples of the board 1532 comprise at least one of a general printed circuit board (PCB), a metal core PCB, a flexible PCB, and a ceramic PCB.

In addition, the board 1532 may be formed of a material capable of efficiently reflecting light. Alternatively, the board 1532 may be coated with a color layer such as a white or silver layer for efficiently reflecting light.

At least one light emitting device package 200 may be disposed on the board 1532. Each of the light emitting device packages 200 may comprise at least one light emitting diode (LED) chip. Examples of the LED chip comprise: a color diode capable of emitting color light such as red light, green light, blue light, or white light; and an ultraviolet (UV) LED capable of emitting an UV ray.

The light emitting module 1530 may comprise a combination of various light emitting device packages 200 to obtain desired color tone and brightness. For example, the light emitting module 1530 may comprise a combination of a white LED, a red LED, and a green LED to ensure a high color rendering index (CRI).

The connection terminal 1520 may be electrically connected to the light emitting module 1530 to supply power. The connection terminal 1520 may be a screw terminal that can be coupled to an external power source socket. However, the current embodiment is not limited thereto. Alternatively, the connection terminal 1520 may be formed in a pin shape. In this case, the connection terminal 1520 may be inserted into an external power source socket or connected to the external power source through a cable.

As described above, the embodiments provide a light emitting device having an improved structure, a method of fabricating the light emitting device, a light emitting device package, and a lighting system.

In addition, the embodiments provide a light emitting device having improved light emitting efficiency and a method of fabricating the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
an active layer on the first conductive type semiconductor layer;
a second conductive type semiconductor layer on the active layer;
an undoped semiconductor layer disposed on the second conductive type semiconductor layer and comprising a plurality of first holes; and
a third conductive type semiconductor layer disposed on the undoped semiconductor layer and comprising a plurality of second holes.

2. The light emitting device according to claim 1, wherein the first holes of the undoped semiconductor layer are overlapped with the second holes of the third conductive type semiconductor layer in a vertical direction.

3. The light emitting device according to claim 1, wherein the first holes of the undoped semiconductor layer are respectively connected to the second holes of the third conductive type semiconductor layer in a vertical direction.

4. The light emitting device according to claim 1, wherein an area of a top surface of the undoped semiconductor layer is smaller than an area of a bottom surface of the third conductive type semiconductor layer.

5. The light emitting device according to claim 1, wherein the holes of the undoped semiconductor layer or the third conductive type semiconductor layer have a horn or truncated horn shape.

6. The light emitting device according to claim 1, wherein each of the holes of the undoped semiconductor layer and the third conductive type semiconductor layer is wider at a top side than at a bottom side.

7. The light emitting device according to claim 1, wherein areas of bottom sides of the second holes of the third conductive type semiconductor layer are different from areas of bottom sides of the first holes of the undoped semiconductor layer.

8. The light emitting device according to claim 1, wherein the holes of at least one of the undoped semiconductor layer and the third conductive type semiconductor layer are arranged at intervals of about 50 nm to about 3000 nm.

9. The light emitting device according to claim 1, wherein the second conductive type semiconductor layer and the third conductive type semiconductor layer are p-type semiconductor layers, and a dopant concentration of the undoped semiconductor layer is much lower than a dopant concentration of the second conductive type semiconductor layer or the third conductive type semiconductor layer.

10. The light emitting device according to claim 1, further comprising:
a substrate under the first conductive type semiconductor layer;
a first electrode on the first conductive type semiconductor layer; and
a second electrode on the second conductive type semiconductor layer.

11. The light emitting device according to claim 10, wherein the second electrode is in contact with the undoped semiconductor layer and the third conductive type semiconductor layer.

12. The light emitting device according to claim 10, wherein the second electrode comprises a transparent electrode layer or a reflective electrode layer that makes contact with the undoped semiconductor layer and the third conductive type semiconductor layer.

13. The light emitting device according to claim 1, further comprising:
an ohmic layer on the second conductive type semiconductor layer;
a reflective layer on the ohmic layer; and
a conductive support member on the reflective layer.

14. The light emitting device according to claim 13, wherein the ohmic layer and the reflective layer are disposed on the undoped semiconductor layer and in the holes of the third conductive type semiconductor layer.

15. The light emitting device according to claim 13, further comprising an electrode under the first conductive type semiconductor layer.

16. A light emitting device packages comprising:
a body;
at least one lead electrode on the body; and
a light emitting device electrically connected to the lead electrode,
wherein the light emitting device comprises:
a first conductive type semiconductor layer;
an active layer on the first conductive type semiconductor layer;
a second conductive type semiconductor layer on the active layer;
an undoped semiconductor layer disposed on the second conductive type semiconductor layer and comprising a plurality of first holes; and
a third conductive type semiconductor layer disposed on the undoped semiconductor layer and comprising a plurality of second holes.

17. The light emitting device package according to claim 16, wherein the first holes of the undoped semiconductor layer are overlapped with the second holes of the third conductive type semiconductor layer in a vertical direction.

18. The light emitting device package according to claim 16, wherein the first holes of the undoped semiconductor layer are respectively connected to the second holes of the third conductive type semiconductor layer in a vertical direction.

19. A lighting system comprising:
a board; and
a light emitting module disposed on the board and comprising a light emitting device,
wherein the light emitting device comprises:
a first conductive type semiconductor layer;
an active layer on the first conductive type semiconductor layer;
a second conductive type semiconductor layer on the active layer;
an undoped semiconductor layer disposed on the second conductive type semiconductor layer and comprising a plurality of first holes; and
a third conductive type semiconductor layer disposed on the undoped semiconductor layer and comprising a plurality of second holes.

20. The lighting system according to claim 19, further comprising at least one of a light guide member, a diffusion sheet, a condensing sheet, a brightness enhancement sheet, and a fluorescence that is disposed on an optical path of light emitted from the light emitting module.

* * * * *